United States Patent
Fukunaga et al.

(10) Patent No.: US 10,822,722 B2
(45) Date of Patent: Nov. 3, 2020

(54) GALLIUM ARSENIDE CRYSTAL BODY AND GALLIUM ARSENIDE CRYSTAL SUBSTRATE

(71) Applicant: Sumitomo Electric Industries, Ltd., Osaka (JP)

(72) Inventors: Hiroshi Fukunaga, Osaka (JP); Katsushi Akita, Osaka (JP); Yukio Ishikawa, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/344,045

(22) PCT Filed: Jul. 4, 2017

(86) PCT No.: PCT/JP2017/024463
§ 371 (c)(1),
(2) Date: Apr. 23, 2019

(87) PCT Pub. No.: WO2019/008663
PCT Pub. Date: Jan. 10, 2019

(65) Prior Publication Data
US 2019/0264348 A1 Aug. 29, 2019

(51) Int. Cl.
*C30B 29/56* (2006.01)
*C30B 29/42* (2006.01)
(Continued)

(52) U.S. Cl.
CPC .............. *C30B 29/42* (2013.01); *C30B 11/00* (2013.01); *C30B 29/40* (2013.01); *H01L 29/207* (2013.01)

(58) Field of Classification Search
CPC .......... C30B 29/56; C30B 15/00; C30B 13/00
See application file for complete search history.

(56) References Cited

U.S. PATENT DOCUMENTS 3,596,148 A * 7/1971 McNeely ................ C30B 11/00
257/6
4,158,851 A * 6/1979 Akai ...................... H01L 29/207
148/33
(Continued)

FOREIGN PATENT DOCUMENTS

CN 1873060 A 12/2006
CN 101724886 A 6/2010
(Continued)

OTHER PUBLICATIONS

Bünger, T. et al., "Active Carbon Control During VGF Growth of Semiinsulating GaAs," presented at International Conference on Compound Semiconductor Mfg. (2003) 3.5, 4 pages.
(Continued)

*Primary Examiner* — Robert M Kunemund
(74) *Attorney, Agent, or Firm* — Faegre Drinker Biddle & Reath LLP

(57) ABSTRACT

In a gallium arsenide crystal body, an etching pit density of the gallium arsenide crystal body is more than or equal to 10 $cm^{-2}$ and less than or equal to 10000 $cm^{-2}$, and an oxygen concentration of the gallium arsenide crystal body is less than $7.0 \times 10^{15}$ atoms·$cm^{-3}$. In a gallium arsenide crystal substrate, an etching pit density of the gallium arsenide crystal substrate is more than or equal to 10 $cm^{-2}$ and less than or equal to 10000 $cm^{-2}$, and an oxygen concentration of the gallium arsenide crystal substrate is less than $7.0 \times 10^{15}$ atoms·$cm^{-3}$.

7 Claims, 4 Drawing Sheets

(51) Int. Cl.
*C30B 11/00* (2006.01)
*H01L 29/207* (2006.01)
*C30B 29/40* (2006.01)

(56) References Cited

U.S. PATENT DOCUMENTS

| | | | |
|---|---|---|---|
| 4,478,675 A | 10/1984 | Akai | |
| 2010/0001288 A1* | 1/2010 | Liu | C30B 11/00 257/75 |
| 2011/0293890 A1* | 12/2011 | Liu | C30B 11/00 428/143 |
| 2012/0292747 A1* | 11/2012 | Miyahara | H01L 21/02052 257/632 |
| 2014/0205527 A1 | 7/2014 | Nakamura et al. | |

FOREIGN PATENT DOCUMENTS

| | | |
|---|---|---|
| JP | S59-12638 B2 | 3/1984 |
| JP | H01-239089 A | 9/1989 |
| JP | H02-157198 A | 6/1990 |
| JP | H06-16493 A | 1/1994 |
| JP | H06-219900 A | 8/1994 |
| JP | 2012-246156 A | 12/2012 |
| WO | WO-2010/079826 A1 | 7/2010 |

OTHER PUBLICATIONS

Rudolph, P. et al., "Growth and characterization of GaAs crystals produced by the VCz method without boric oxide encapsulation," Journal of Crystal Growth 292 (2006) 532-537.

Chinese Office Action dated Aug. 5, 2020, in Chinese Application No. 201780087442.6.

L. Lin et al., "Behaviors of Impurities and Defects in Gallium Arsenide," *Proceedings of the Conference on Gallium Arsenide and Other III-V Compound Semiconductors in 1977*, pp. 26-46.

* cited by examiner

GALLIUM ARSENIDE CRYSTAL BODY AND GALLIUM ARSENIDE CRYSTAL SUBSTRATE

TECHNICAL FIELD

The present invention relates to a gallium arsenide crystal body and a gallium arsenide crystal substrate.

BACKGROUND ART

A compound semiconductor substrate, such as a gallium arsenide crystal substrate, has been suitably used as a substrate of a semiconductor device. It has been required to develop a compound semiconductor substrate on which a high-quality epitaxial layer can be grown to form a semiconductor device having high characteristics.

T. Bunger et al, "Active Carbon Control During VGF Growth of Semiinsulating GaAs", presented at International Conference on Compound Semiconductor Mfg. (2003) 3.5 (Non-Patent Literature 1) discloses that in order to grow a semi-insulating GaAs (gallium arsenide) crystal, a carbon concentration in the GaAs crystal is adjusted by adjusting an oxygen concentration in a GaAs source material melt.

CITATION LIST

Non Patent Literature

NPL 1: T. Bunger et al, "Active Carbon Control During VGF Growth of Semiinsulating GaAs", presented at International Conference on Compound Semiconductor Mfg. (2003) 3.5

SUMMARY OF INVENTION

In a gallium arsenide crystal body according to the present disclosure, an etching pit density of the gallium arsenide crystal body is more than or equal to 10 cm$^{-2}$ and less than or equal to 10000 cm$^{-2}$, and an oxygen concentration of the gallium arsenide crystal body is less than $7.0 \times 10^{15}$ atoms·cm$^{-3}$.

In a gallium arsenide crystal substrate according to the present disclosure, an etching pit density of the gallium arsenide crystal substrate is more than or equal to 10 cm$^{-2}$ and less than or equal to 10000 cm$^{-2}$, and an oxygen concentration of the gallium arsenide crystal substrate is less than $7.0 \times 10^{15}$ atoms·cm$^{-3}$.

DETAILED DESCRIPTION

Figure 1:
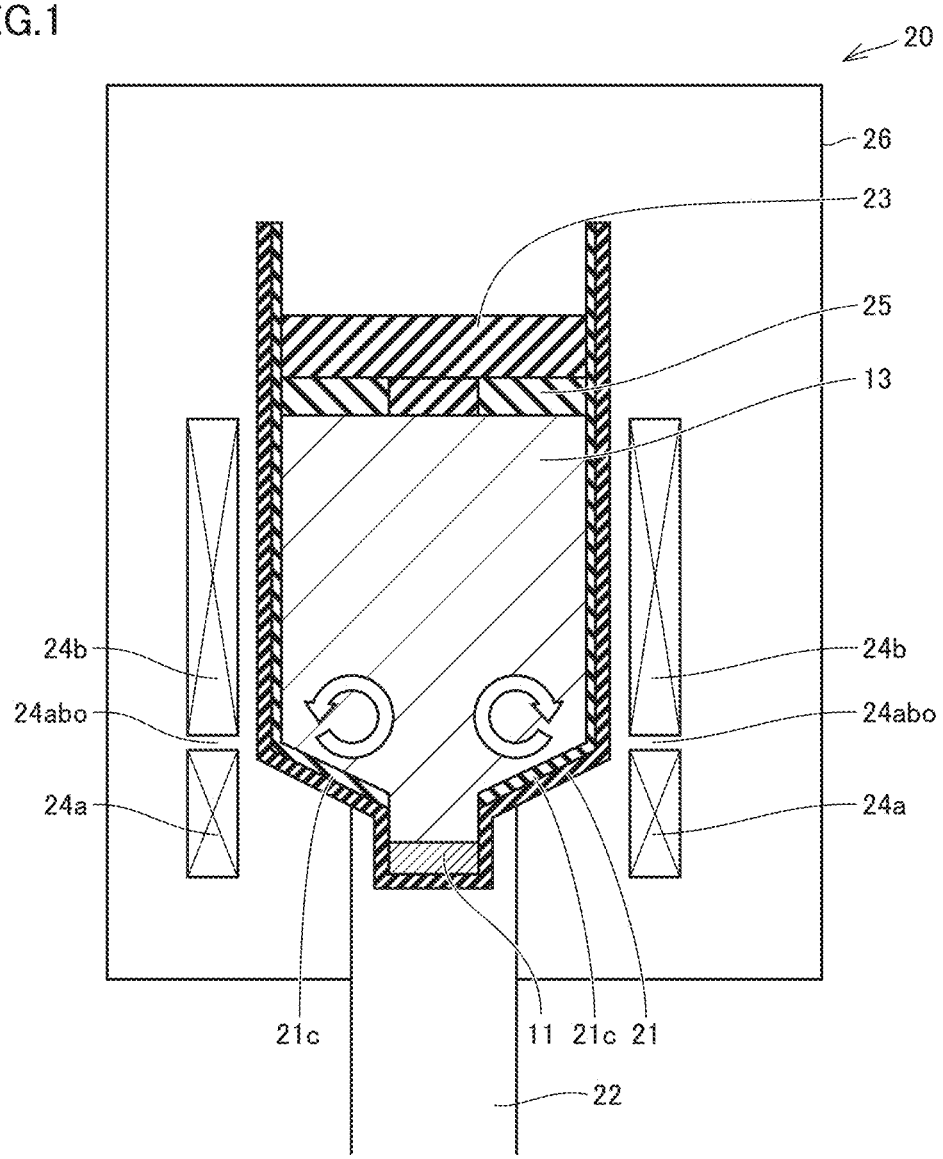
FIG. 1 is a schematic cross sectional view showing exemplary manufacturing method and manufacturing apparatus for a gallium arsenide crystal body in the present disclosure.

Problems to be Solved by the Present Disclosure

In the manufacturing of the GaAs crystal as disclosed in T. Bunger et al, "Active Carbon Control During VGF Growth of Semiinsulating GaAs", presented at International Conference on Compound Semiconductor Mfg. (2003) 3.5 (Non-Patent Literature 1), the oxygen concentration in the GaAs source material melt is high, and oxygen reacts with an added dopant (for example, C (carbon)), with the result that an amount of incorporation of the dopant is decreased. This leads to inefficient adjustment of the insulating property or conductivity of the GaAs crystal, disadvantageously. Moreover, when the oxygen concentration in the GaAs source material melt is high, the grown GaAs crystal is hardened and is likely to be cracked when being processed, thus resulting in a decreased processing yield, disadvantageously.

In order to solve the above-described problems, the present disclosure has an object to provide a gallium arsenide crystal body and a gallium arsenide crystal substrate, in each of which an insulating property or conductivity can be efficiently adjusted and each of which is suppressed from being cracked when being processed to result in a high processing yield.

Advantageous Effect of the Present Disclosure

According to the present disclosure, there can be provided a gallium arsenide crystal body and a gallium arsenide crystal substrate, in each of which an insulating property or conductivity can be efficiently adjusted and each of which is suppressed from being cracked when being processed to result in a high processing yield.

Description of Embodiments

First, embodiments of the present invention are listed and described.

[1] In a gallium arsenide crystal body according to an embodiment of the present invention, an etching pit density of the gallium arsenide crystal body is more than or equal to 10 cm$^{-2}$ and less than or equal to 10000 cm$^{-2}$, and an oxygen concentration of the gallium arsenide crystal body is less than $7.0 \times 10^{15}$ atoms·cm$^{-3}$. Since the etching pit density and the oxygen concentration are very low in the gallium arsenide crystal body according to the present embodiment, the insulating property or conductivity thereof can be efficiently adjusted and cracking upon processing is suppressed to result in a high processing yield.

[2] In the gallium arsenide crystal body according to the present embodiment, the oxygen concentration can be more than or equal to $2.0 \times 10^{14}$ atoms·cm$^{-3}$ and less than or equal to $5.0 \times 10^{5}$ atoms·cm$^{-3}$. Since the oxygen concentration is much lower in such a gallium arsenide crystal body, the insulating property or conductivity thereof can be efficiently adjusted and cracking upon processing is suppressed to result in a high processing yield.

[3] The gallium arsenide crystal body according to the present embodiment can include a straight body portion having a cylindrical shape, wherein a diameter of the straight body portion can be more than or equal to 100 mm and less than or equal to 305 mm. Even though the diameter of the straight body portion of such a gallium arsenide crystal body is so large as to be more than or equal to 100 mm and less than or equal to 305 mm, since the etching pit density and the oxygen concentration are very low in the gallium arsenide crystal body, the insulating property or conductivity thereof can be efficiently adjusted and cracking upon processing is suppressed to result in a high processing yield.

[4] In the gallium arsenide crystal body according to the present embodiment, an n type conductivity impurity concentration of the gallium arsenide crystal body can be more than or equal to $1.0 \times 10^{15}$ atoms·cm$^{-3}$ and less than or equal to $1.0 \times 10^{20}$ atoms·cm$^{-3}$. Since such a gallium arsenide crystal body has n type conductivity and the etching pit density and the oxygen concentration are very low in the gallium arsenide crystal body, the conductivity thereof can be efficiently adjusted and cracking upon processing is suppressed to result in a high processing yield.

[5] In the gallium arsenide crystal body according to the present embodiment, a specific resistance of the gallium arsenide crystal body can be more than or equal to $1.2 \times 10^7$ Ω·cm and less than or equal to $5.0 \times 10^8$ Ω·cm. Since such a gallium arsenide crystal body has a semi-insulating property and the etching pit density and oxygen concentration are very low in the gallium arsenide crystal body, the insulating property thereof can be efficiently adjusted and cracking upon processing is suppressed to result in a high processing yield.

[6] In the gallium arsenide crystal body according to the present embodiment, a boron concentration of the gallium arsenide crystal body can be less than or equal to $1.0 \times 10^{19}$ atoms·cm$^{-3}$. Since such a gallium arsenide crystal body has excellent quality after the epitaxial growth due to a high dopant activation ratio and the etching pit density and the oxygen concentration are very low in the gallium arsenide crystal body, the conductivity thereof can be efficiently adjusted and cracking upon processing is suppressed to result in a high processing yield.

[7] In a gallium arsenide crystal substrate according to another embodiment of the present invention, an etching pit density of the gallium arsenide crystal substrate is more than or equal to 10 cm$^{-2}$ and less than or equal to 10000 cm$^{-2}$, and an oxygen concentration of the gallium arsenide crystal substrate is less than $7.0 \times 10^{15}$ atoms·cm$^{-3}$. Since the etching pit density and the oxygen concentration are very low in the gallium arsenide crystal substrate according to the present embodiment, the insulating property or conductivity thereof can be efficiently adjusted and cracking upon processing is suppressed to result in a high processing yield.

[8] In the gallium arsenide crystal substrate according to the present embodiment, the oxygen concentration can be more than or equal to $2.0 \times 10^{14}$ atoms·cm$^{-3}$ and less than or equal to $5.0 \times 10^{15}$ atoms·cm$^{-3}$. Since the oxygen concentration is much lower in such a gallium arsenide crystal substrate, the insulating property or conductivity thereof can be efficiently adjusted and cracking upon processing is suppressed to result in a high processing yield.

[9] In the gallium arsenide crystal substrate according to the present embodiment, a diameter of the gallium arsenide crystal substrate can be more than or equal to 100 mm and less than or equal to 305 mm. Even though the diameter of such a gallium arsenide crystal substrate is so large as to be more than or equal to 100 mm and less than or equal to 305 mm, since the etching pit density and the oxygen concentration are very low in the gallium arsenide crystal substrate, the insulating property or conductivity thereof can be efficiently adjusted and cracking upon processing is suppressed to result in a high processing yield.

[10] In the gallium arsenide crystal substrate according to the present embodiment, an n type conductivity impurity concentration of the gallium arsenide crystal substrate can be more than or equal to $1.0 \times 10^{15}$ atoms·cm$^{-3}$ and less than or equal to $1.0 \times 10^{20}$ atoms·cm$^{-3}$. Since such a gallium arsenide crystal substrate has n type conductivity and the etching pit density and the oxygen concentration are very low in the gallium arsenide crystal body, the conductivity thereof can be efficiently adjusted and cracking upon processing is suppressed to result in a high processing yield.

[11] In the gallium arsenide crystal substrate according to the present embodiment, a specific resistance of the gallium arsenide crystal substrate can be more than or equal to $1.2 \times 10^7$ Ω·cm and less than or equal to $5.0 \times 10^8$ Ω·cm. Since such a gallium arsenide crystal substrate has a semi-insulating property and the etching pit density and the oxygen concentration are very low in the gallium arsenide crystal substrate, the insulating property thereof can be efficiently adjusted and cracking upon processing is suppressed to result in a high processing yield.

[12] In the gallium arsenide crystal substrate according to the present embodiment, a boron concentration of the gallium arsenide crystal substrate can be less than or equal to $1.0 \times 10^{19}$ atoms·cm$^{-3}$. Since such a gallium arsenide crystal substrate has excellent quality after the epitaxial growth due to a high dopant activation ratio and the etching pit density and the oxygen concentration are very low in the gallium arsenide crystal substrate, the conductivity thereof can be efficiently adjusted and cracking upon processing is suppressed to result in a high processing yield.

[13] In a gallium arsenide crystal substrate according to the present embodiment, an etching pit density of the gallium arsenide crystal substrate can be more than or equal to 10 cm$^{-2}$ and less than or equal to 10000 cm$^{-2}$, an oxygen concentration of the gallium arsenide crystal substrate can be more than or equal to $2.0 \times 10^{14}$ atoms·cm$^{-3}$ and less than or equal to $5.0 \times 10^{15}$ atoms·cm$^{-3}$, a boron concentration of the gallium arsenide crystal substrate can be less than or equal to $1.0 \times 10^{19}$ atoms·cm$^{-3}$, and a diameter of the gallium arsenide crystal substrate can be more than or equal to 100 mm and less than or equal to 305 mm. Even though the diameter of such a gallium arsenide crystal substrate is so large as to be more than or equal to 100 mm and less than or equal to 305 mm, since the etching pit density and the oxygen concentration are very low in the gallium arsenide crystal substrate, the insulating property thereof can be efficiently adjusted and cracking upon processing is suppressed to result in a high processing yield.

Details of Embodiments

First Embodiment: Gallium Arsenide Crystal Body

An EPD (etching pit density) of a GaAs (gallium arsenide) crystal body of the present embodiment is more than or equal to 10 cm$^{-2}$ and less than or equal to 10000 cm$^{-2}$, and an oxygen concentration of the GaAs crystal body is less than $7.0 \times 10^{15}$ atoms·cm$^{-3}$. The EPD and oxygen concentration of the GaAs crystal body of the present embodiment are very low. Since the EPD is so low as to be more than or equal to 10 cm$^{-2}$ and less than or equal to 10000 cm$^{-2}$, the GaAs crystal body is less likely to be cracked when being processed, thus resulting in a high processing yield. Moreover, since the oxygen concentration is so low as to be less than $7.0 \times 10^{15}$ atoms·cm$^{-3}$, the insulating property or conductivity of the GaAs crystal can be efficiently adjusted.

(Etching Pit Density)

The term "EPD (etching pit density)" refers to the number of etch pits (etching pits), which are generated in a crystal surface when the surface is treated with a chemical, per unit area. Specifically, the EPD of the GaAs crystal body of the present embodiment refers to the number of etch pits, which are generated in the surface when treated with 25 mass % of a KOH (potassium hydroxide) aqueous solution for 30 minutes at 350° C., per unit area. The EPD of the GaAs crystal body of the present embodiment is more than or equal to 10 cm$^{-2}$ and less than or equal to 10000 cm$^{-2}$. In order to suppress the GaAs crystal body from being cracked when being processed, the EPD of the GaAs crystal body is less than or equal to 10000 cm$^{-2}$, is preferably less than or equal to 7000 cm$^{-2}$, and is more preferably less than or equal to 4000 cm$^{-2}$. In view of a current manufacturing technology level for the GaAs crystal body, the EPD of the GaAs crystal body is more than or equal to 10 cm$^{-2}$.

(Oxygen Concentration)

The oxygen concentration is measured by CPAA (Charged Particle Activation Analysis). CPAA is an activation analysis in which a target element is quantified by measuring radiations emitted from radionuclide generated by impacting with high-energy charged particles. In quantifying the oxygen concentration of the GaAs crystal body, $^3$He or the like is used as the charged particles. The oxygen concentration can be also measured by SIMS (Secondary Ion Mass Spectrometry); however, since the detection limit in CPAA is about $2.0 \times 10^{14}$ atoms·cm$^{-3}$ while the detection limit in SIMS is about $1 \times 10^{16}$ atoms·cm$^{-3}$, CPAA is suitable for precision measurement of a low oxygen concentration of about more than or equal to $2.0 \times 10^{14}$ atoms·cm$^{-3}$ and about less than $7.0 \times 10^{15}$ atoms·cm$^{-3}$.

Here, in the CPAA for the oxygen concentration, $^{18}$F is used which is generated by a nuclear reaction between $^3$He and oxygen, $^{16}$O, in the GaAs crystal body and which undergoes $\beta^-$ decay with a half-life of 109.73 minutes. The GaAs crystal body having been irradiated with $^3$He is melted with an acid, and generated $^{18}$F is chemically separated by way of a KBF$_4$ (potassium tetrafluoroborate) precipitation method. Gamma rays of 511 keV, which are generated by positron annihilation upon the $\beta^+$ decay of $^{18}$F, are measured using a NaI detector to determine the number of counts for a specified time after the end of the irradiation by the least squares method. The number of counts after the specified time as determined using a standard sample, SiO$_2$, in the same manner is used for correction, thereby converting it to the oxygen concentration.

The oxygen concentration of the GaAs crystal body of the present embodiment is less than $7.0 \times 10^{15}$ atoms·cm$^{-3}$. In order to achieve efficient adjustment of the insulating property or conductivity of the GaAs crystal, the oxygen concentration is less than $7.0 \times 10^{15}$ atoms·cm$^{-3}$, is preferably less than or equal to $5.0 \times 10^{15}$ atoms·cm$^{-3}$, and is more preferably less than or equal to $3.0 \times 10^{15}$ atoms·cm$^{-3}$. In view of the current manufacturing technology level for the GaAs crystal body, the oxygen concentration is more than or equal to $2.0 \times 10^{14}$ atoms·cm$^{-3}$.

(Diameter of Straight Body Portion)

Since the GaAs crystal body of the present embodiment is often manufactured by, but not particularly limited to, a boat method such as a VB (Vertical Bridgman) method or a VGF (Vertical Gradient Freezing) method as described below, the GaAs crystal body includes a straight body portion having a cylindrical shape, and the diameter of the straight body portion is preferably more than or equal to 100 mm and less than or equal to 305 mm. Even though the diameter of the straight body portion of the GaAs crystal body is so large as to be more than or equal to 100 mm and less than or equal to 305 mm, the etching pit density and the oxygen concentration are very low. In order to achieve low EPD and oxygen concentration in the large-sized GaAs crystal body, the diameter of the straight body portion of the GaAs crystal body is preferably more than or equal to 100 mm, and is more preferably more than or equal to 150 mm. In view of the current manufacturing technology level, the diameter of the straight body portion of the GaAs crystal body is preferably less than or equal to 305 mm, and is more preferably less than or equal to 204 mm.

(n Type Conductivity Impurity Concentration)

In order to provide the GaAs crystal body of the present embodiment with n type conductivity and very low EPD and oxygen concentration, an n type conductivity impurity concentration (concentration of an impurity for providing the GaAs crystal body with n type conductivity) of the GaAs crystal body of the present embodiment is preferably more than or equal to $1.0 \times 10^{15}$ atoms·cm$^{-3}$ and less than or equal to $1.0 \times 10^{20}$ atoms·cm$^{-3}$. In order to effectively provide the GaAs crystal body with n type conductivity, the n type conductivity impurity concentration is preferably more than or equal to $1.0 \times 10^{15}$ atoms·cm$^{-3}$, and is more preferably more than or equal to $1.0 \times 10^{17}$ atoms·cm$^{-3}$. In order to avoid a decreased activation ratio of the dopant, the n type conductivity impurity concentration is preferably less than or equal to $1.0 \times 10^{20}$ atoms·cm$^{-3}$, and is more preferably less than or equal to $5.0 \times 10^{18}$ atoms·cm$^{-3}$. The n type conductivity impurity is not particularly limited, but is preferably silicon in order to effectively provide the GaAs crystal body with n type conductivity. A silicon concentration is measured by GDMS (Glow Discharge Mass Spectrometry).

(Specific Resistance)

In order to provide the GaAs crystal body of the present embodiment with a semi-insulating property and very low EPD and oxygen concentration, the specific resistance of the GaAs crystal body of the present embodiment is preferably more than or equal to $1.2 \times 10^7$ $\Omega$·cm and less than or equal to $5.0 \times 10^8$ $\Omega$·cm, and is more preferably more than or equal to $5.0 \times 10^7$ $\Omega$·cm and less than or equal to $5.0 \times 10^8$ $\Omega$·cm. The specific resistance is measured by way of Hall measurement in accordance with the van der Pauw method.

(Semi-Insulating Impurity Concentration)

The semi-insulating impurity for providing the GaAs crystal body of the present embodiment with a semi-insulating property is not particularly limited, but is preferably carbon in order to effectively provide the GaAs crystal body with the semi-insulating property. In order to provide the GaAs crystal body with a semi-insulating property with a specific resistance of more than or equal to $1.2 \times 10^7$ $\Omega$·cm and less than or equal to $5.0 \times 10^8$ $\Omega$·cm, the carbon concentration is preferably more than or equal to $5.0 \times 10^{14}$ atoms·cm$^{-3}$ and less than or equal to $1.5 \times 10^{16}$ atoms·cm$^{-3}$, and is more preferably more than or equal to $8.0 \times 10^{14}$ atoms·cm$^{-3}$ and less than or equal to $1.3 \times 10^{16}$ atoms·cm$^{-3}$. Carbon can be added more effectively as the oxygen concentration of the GaAs crystal body is lower. Hence, a lower oxygen concentration is more preferable in order to increase the carbon concentration. The carbon concentration is measured by CPAA (Charged Particle Activation Analysis).

(Boron Concentration)

The GaAs crystal body of the present embodiment is manufactured by the boat method using a crucible, such as the VB (Vertical Bridgman) method and the VGF (Vertical Gradient Freezing) method, as described below. The crucible generally includes boron (PBN (pyrolytic boron nitride) is generally used for crucibles, and a boron oxide film is used as a sealing member on an inner wall surface thereof in contact with a GaAs source material). Accordingly, the GaAs crystal body of the present embodiment includes boron. In order to prevent a decreased dopant activation ratio in the GaAs crystal body, the boron concentration of the GaAs crystal body of the present embodiment is preferably less than or equal to $1.0 \times 10^{19}$ atoms·cm$^{-3}$ and is more preferably less than or equal to $8.0 \times 10^{18}$ atoms·cm$^{-3}$. Moreover, in view of the current manufacturing technology level, the boron concentration of the GaAs crystal body is preferably more than or equal to $5.0 \times 10^{16}$ atoms·cm$^{-3}$. The boron concentration is measured by GDMS (Glow Discharge Mass Spectrometry).

(Manufacturing Apparatus for Gallium Arsenide Crystal Body)

With reference to FIG. 1, although not particularly limited, in order to efficiently manufacture the GaAs crystal body having an EPD of more than or equal to 10 cm$^{-2}$ and less than or equal to 10000 cm$^{-2}$ and an oxygen concentration of less than $7.0 \times 10^{15}$ atoms·cm$^{-3}$, a manufacturing apparatus for the GaAs (gallium arsenide) crystal body in the present embodiment preferably includes a crucible 21, a crucible holder 22, a sealing member 23, heaters 24a, 24b, a closure plate 25, and a chamber 26.

Crucible 21 includes a seed crystal holding portion and a crystal growth portion connected onto the seed crystal holding portion. The seed crystal holding portion is a hollow cylindrical portion that opens at a side connected to the crystal growth portion and that is provided with a bottom wall at a side opposite thereto. At this portion, a GaAs seed crystal 11 can be held. The crystal growth portion includes: a conical portion having a conical shape and connected to the seed crystal holding portion at the small-diameter side in the axial direction; and a hollow cylindrical straight body portion connected to the large-diameter side of the conical portion in the axial direction. The crystal growth portion has a function of holding a GaAs source material 13 therein and growing the GaAs crystal body by solidifying heated GaAs source material 13 in a molten state.

Here, a material of crucible 21 is not particularly limited as long as the material has a high mechanical strength and can withstand a temperature at which the source material is melted. For example, PBN (pyrolytic boron nitride) can be employed suitably therefor. Moreover, in order to prevent adhesion of GaAs to the inner wall surface of crucible 21, an oxide film 21c, such as a boron oxide film, is preferably formed on the inner wall surface as a sealing member. Examples of the boron oxide film include a $B_2O_3$ film and the like. For example, the $B_2O_3$ film can be formed on the inner wall surface of crucible 21 by treating crucible 21, which is composed of PBN, at a high temperature of more than or equal to 1000° C. in an atmosphere containing more than or equal to 50 volume % of oxygen.

A material of sealing member 23 is not particularly limited as long as the material can withstand the temperature at which the source material is melted. A boron oxide, such as $B_2O_3$, can be employed suitably therefor.

The plurality of heaters 24a, 24b are normally placed to appropriately control the melting and solidification of GaAs source material 13; however, in order to reduce the EPD and the oxygen concentration in the GaAs crystal body to be grown, a smaller number of inter-heater gaps are preferably provided. One inter-heater gap is preferably provided. That is, a smaller number of heaters are preferably provided. Two heaters are preferably provided.

Figure 2:
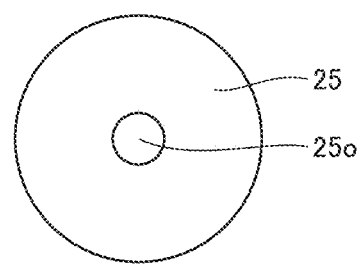
FIG. 2 is a schematic plan view showing an exemplary closure plate used in the manufacturing method and manufacturing apparatus for the gallium arsenide crystal body in the present disclosure.

Closure plate 25 is preferably disposed between GaAs source material 13 and sealing member 23 in order to reduce the oxygen concentration in the GaAs crystal body to be grown. A material of closure plate 25 is not particularly limited as long as the material has a high mechanical strength and can withstand a temperature at which the source material is melted. For example, PBN (pyrolytic boron nitride) can be employed suitably therefor. A closure ratio (percentage of the area of the closure plate with respect to the cross sectional area of the straight body portion of crucible 21 perpendicular to the axial direction; the same applies to the description below) of closure plate 25 is preferably more than or equal to 75% and less than or equal to 100% and is more preferably more than or equal to 90% and less than or equal to 98% in order to reduce the EPD and the oxygen concentration in the GaAs crystal body to be grown and prevent breakage of the crucible. It should be noted that with reference to FIG. 2, closure plate 25 may be provided with an opening 25o for adjusting the closure ratio.

(Method for Manufacturing Gallium Arsenide Crystal Body)

With reference to FIG. 1, although not particularly limited, in order to efficiently grow a GaAs (gallium arsenide) crystal body having low EPD and oxygen concentration, a method for manufacturing the GaAs crystal body in the present embodiment is preferably based on the boat method, such as the VB (Vertical Bridgman) method or the VGF (Vertical Gradient Freezing) method, using the above-described manufacturing apparatus 20. Further, in order to manufacture a GaAs crystal body having a straight body portion with a large diameter, the VB method is more preferable. Specifically, the method for manufacturing the GaAs crystal body in the present embodiment preferably includes a GaAs seed crystal loading step, a GaAs source material loading step, a closure plate placing step, a sealing member placing step, and a crystal growing step.

First, manufacturing apparatus 20 is used to load GaAs seed crystal 11 in the seed crystal holding portion of crucible 21 in the GaAs seed crystal loading step. Next, in the GaAs source material loading step, GaAs source material 13 is loaded in the crystal growth portion (the conical portion and the straight body portion) of crucible 21. Here, GaAs source material 13 is not particularly limited as long as it is GaAs having high purity (for example, more than or equal to 99.9 mass %). A GaAs polycrystal body, a portion of a GaAs single crystal with a poor physical property, or the like is used suitably therefor. Next, in the closure plate placing step, closure plate 25 is placed on GaAs source material 13 in crucible 21. Next, in the sealing member placing step, sealing member 23 is placed on closure plate 25 in crucible 21.

Next, in the crystal growing step, crucible 21 in which GaAs seed crystal 11, GaAs source material 13, closure plate 25, and sealing member 23 are disposed in this order from below to above is loaded in crystal apparatus 20. Crucible 21 is held by crucible holder 22, and heaters 24a, 24b are disposed to surround crucible 21. Next, crucible 21 is heated by supplying electric current to heaters 24a, 24b. Accordingly, GaAs source material 13 is melted into a melt and sealing member 23 is also melted into a liquid sealing member. Moreover, an oxide film is formed in the inner wall of crucible 21 due to oxidation of the material of crucible 21.

Figure 3:
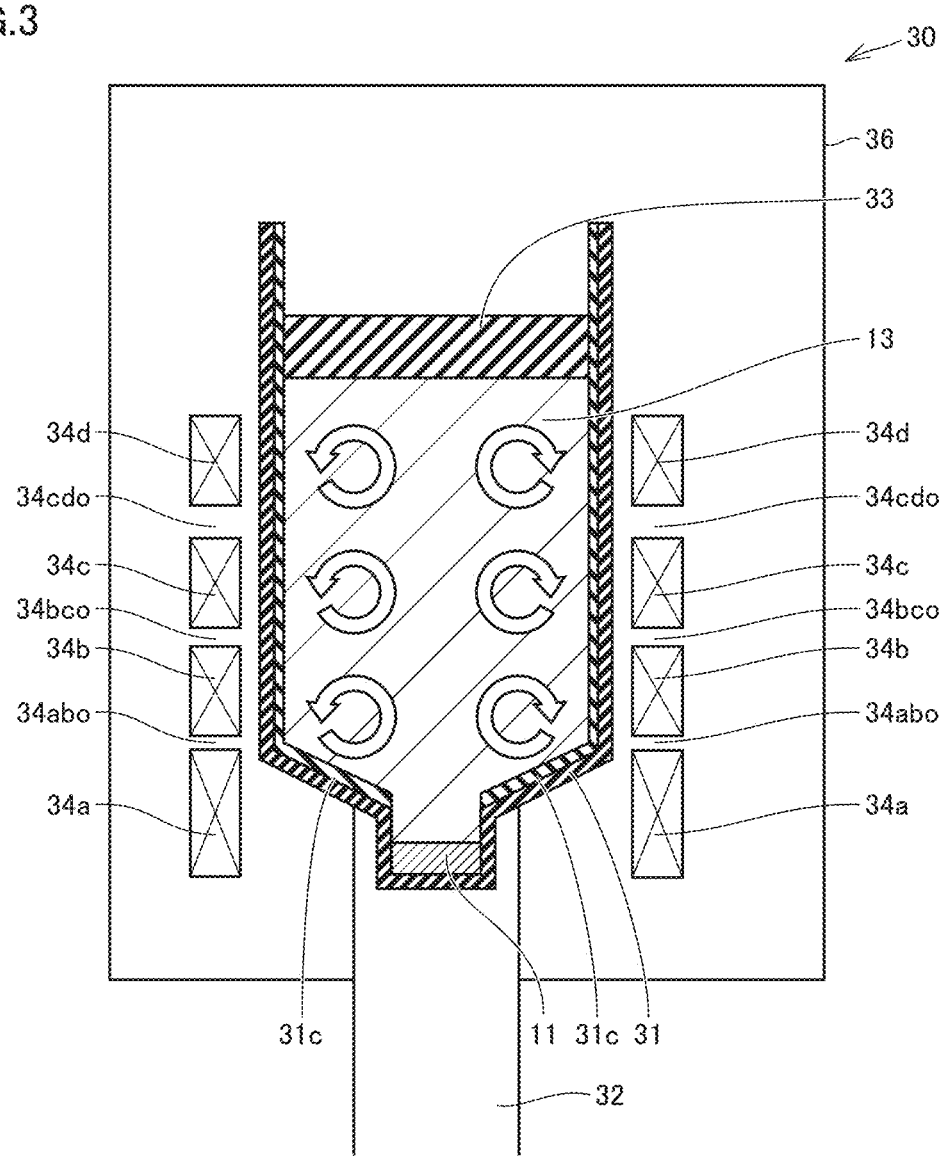
FIG. 3 is a schematic cross sectional view showing exemplary, typical manufacturing method and manufacturing apparatus for a gallium arsenide crystal body.

On this occasion, the melt of GaAs source material 13 is stirred by convection currents generated due to local low-temperature portions formed by the presence of inter-heater gap 24abo between heater 24a and heater 24b. The stirred GaAs source material 13 is brought into contact with oxide film 21c of the inner wall of crucible 21 and/or sealing member 23, whereby oxygen included in oxide film 21c of the inner wall of crucible 21 and/or sealing member 23 is presumably incorporated into GaAs source material 13. Here, with reference to FIG. 3, in a typical manufacturing apparatus 30, three or more heaters 34a, 34b, 34c, 34d are disposed. Hence, there are two or more inter-heater gaps 34abo, 34bco, and 34cdo. Accordingly, many convection currents are generated by resultant local low-temperature portions, with the result that a large amount of oxygen included in oxide film 31c of the inner wall of crucible 31 and/or sealing member 33 is incorporated into GaAs source material 13. On the other hand, with reference to FIG. 1, only two heaters 24a, 24b are disposed in manufacturing apparatus 20 of the present embodiment. Hence, there is only one inter-heater gap 24abo. Accordingly, fewer convention currents are generated by resultant local low-temperature portions, with the result that oxygen is suppressed from being incorporated into GaAs source material 13.

Further, in manufacturing apparatus 20 of the present embodiment, closure plate 25 is disposed between GaAs source material 13 and sealing member 23. Accordingly, contact between GaAs source material 13 and sealing member 23 is suppressed, with the result that oxygen is suppressed from being incorporated into GaAs source material 13.

Next, a temperature gradient in which a temperature at the GaAs seed crystal 11 side is relatively low and a temperature at the GaAs source material 13 side is relatively high in the axial direction of crucible 21 is formed by moving crucible 21 to the lower side in the axial direction in the case of the VB method or by adjusting the temperature of each of heaters 24a, 24b in the case of the VGF method. Accordingly, molten GaAs source material 13 is sequentially solidified from the GaAs seed crystal 11 side, whereby a GaAs crystal is grown. Molten GaAs source material 13 in the conical portion and straight body portion of the crystal growth portion is entirely solidified in this order, thereby forming the GaAs crystal body. In the VB method, a moving speed (pulling-down speed) of crucible 21 is not particularly limited, and can be, for example, more than or equal to 2.0 mm/h and less than or equal to 5.0 mm/h. In this way, the GaAs crystal body having very low EPD and oxygen concentration is obtained.

It should be noted that in the method for manufacturing the GaAs crystal body in the present embodiment, as the diameter of the straight body portion of the grown crystal body becomes larger, a temperature difference is more likely to occur in the GaAs melt to more facilitate stirring by convection currents, with the result that the oxygen concentration in the GaAs crystal body is likely to be higher. According to the method for manufacturing the GaAs crystal body in the present embodiment, oxygen can be suppressed from being incorporated into the GaAs source material because the contact area between the source material and the sealing member is reduced by placing the closure plate and the convection currents are reduced by an appropriate heater structure and heat environmental design.

Second Embodiment: Gallium Arsenide Crystal Substrate

An EPD (etching pit density) of a GaAs (gallium arsenide) crystal substrate of the present embodiment is more than or equal to 10 $cm^{-2}$ and less than or equal to 10000 $cm^{-2}$, and an oxygen concentration of the GaAs crystal substrate is less than 7.0×10$^{15}$ atoms·$cm^{-3}$. The EPD and oxygen concentration of the GaAs crystal substrate of the present embodiment are very low. Since the EPD is so low as to be more than or equal to 10 $cm^{-2}$ and less than or equal to 10000 $cm^{-2}$, the GaAs crystal substrate is less likely to be cracked when being processed, thus resulting in a high processing yield. Moreover, since the oxygen concentration is so low as to be less than 7.0×10$^{15}$ atoms·$cm^{-3}$, the insulating property or conductivity of the GaAs crystal can be efficiently adjusted.

As with the GaAs crystal body of the first embodiment, in the GaAs crystal substrate of the present embodiment, the oxygen concentration is preferably more than or equal to 2.0×10$^{14}$ atoms·$cm^{-3}$ and less than or equal to 5.0×10$^{15}$ atoms·$cm^{-3}$, the diameter is preferably more than or equal to 100 mm and less than or equal to 305 mm, the n type conductivity impurity concentration can be more than or equal to 1.0×10$^{15}$ atoms·$cm^{-3}$ and less than or equal to 1.0×10$^{20}$ atoms·$cm^{-3}$, the specific resistance can be more than or equal to 1.2×10$^7$ Ω·cm and less than or equal to 5.0×10$^8$ Ω·cm, and the boron concentration is preferably less than or equal to 1.0×10$^{19}$ atoms·$cm^{-3}$. As described below, the GaAs crystal substrate of the present embodiment can be obtained by processing and polishing the GaAs crystal body of the first embodiment, and therefore has the same physical properties (EPD, oxygen concentration, diameter, n type conductivity impurity concentration, specific resistance, and boron concentration) as those of the GaAs crystal body of the first embodiment. Hence, these physical properties are not repeatedly described.

Preferably, in the GaAs crystal substrate of the present embodiment, the etching pit density is more than or equal to 10 $cm^{-2}$ and less than or equal to 10000 $cm^{-2}$, the oxygen concentration is more than or equal to 2.0×10$^{14}$ atoms·$cm^{-3}$ and less than or equal to 5.0×10$^{15}$ atoms·$cm^{-3}$, the boron concentration is less than or equal to 1.0×10$^{19}$ atoms·$cm^{-3}$, and the diameter is more than or equal to 100 mm and less than or equal to 305 mm. Even though the GaAs crystal substrate has such a large diameter of more than or equal to 100 mm and less than or equal to 305 mm, the processing yield of the GaAs crystal is high because the etching pit density is low, and the insulating property or conductivity of the GaAs crystal can be efficiently adjusted because the oxygen concentration is very low.

Although not particularly limited, a method for manufacturing the GaAs crystal substrate in the present embodiment preferably includes a processing step and a polishing step using the GaAs crystal body of the first embodiment in order to efficiently form a GaAs crystal substrate having a low EPD and a low oxygen concentration. In the processing step, the outer circumference of the GaAs crystal body is ground and the GaAs crystal body having been ground is sliced in an appropriately specified direction, thereby obtaining a GaAs crystal substrate having a main surface in the appropriately specified plane orientation. Next, in the polishing step, the main surface of the GaAs crystal substrate is subjected to mechanical polishing and/or chemical mechanical polishing (CMP), thereby obtaining a GaAs crystal substrate having a main surface polished to be a mirror surface.

EXAMPLES

Examples I

1. Production of GaAs Crystal Body

A manufacturing apparatus such as one shown in FIG. 1 was used to grow, in accordance with the VB method, four n type conductivity GaAs crystal bodies having different silicon concentrations by adding Si (silicon) as the n type conductivity impurity (Examples I-1 to I-5). As the GaAs source material, a GaAs polycrystal having a purity of 99.9 mass % was used. A PBN plate was used as the closure plate. $B_2O_3$ was used as the sealing member. The closure ratio of the closure plate and the number of inter-heater gaps were as shown in Table 1. Each of the GaAs crystal bodies was grown by adjusting a temperature distribution in the crucible to attain a temperature gradient of less than or equal to 1° C./mm at a crystal growth interface in a crystal growth direction.

2. Production of GaAs Crystal Substrate

The outer circumference of the obtained GaAs crystal body was ground and the obtained GaAs crystal body was sliced along a plane perpendicular to the crystal growth direction. Then, the main surface thereof was subjected to mechanical polishing and chemical mechanical polishing (CMP), thereby producing GaAs crystal substrates each having a diameter shown in Table 1 and a thickness of more than or equal to 325 μm and less than or equal to 700 μm (Examples I-1 to I-5). The EPD, oxygen concentration, silicon concentration, boron concentration, and specific resistance of each of the obtained GaAs crystal substrates were measured. The EPD was measured through image analysis by measuring the number of etch pits, which were generated in the surface thereof when the GaAs crystal substrate was soaked in 25 mass % of a KOH aqueous solution at 350° C. for 30 minutes, per unit area. The oxygen concentration was measured by CPAA (Charged Particle Activation Analysis). The silicon concentration and the boron concentration were measured by GDMS (Glow Discharge Mass Spectrometry). The specific resistance was measured by way of Hall measurement in accordance with the van der Pauw method. Results thereof are collectively shown in Table 1, FIG. 4 and FIG. 5. Here, FIG. 4 and FIG. 5 include examples other than Examples I-1 to I-5.

Examples II

1. Production of GaAs Crystal Body

A manufacturing apparatus such as one shown in FIG. 1 was used to grow, in accordance with the VB method, five semi-insulating GaAs crystal bodies having different carbon concentrations and specific resistances by adding C (carbon) as the semi-insulating impurity (Examples II-1 to II-5). As the GaAs source material, a GaAs polycrystal having a purity of 99.9 mass % was used. A PBN plate was used as the closure plate. $B_2O_3$ was used as the sealing member. The closure ratio of the closure plate and the number of inter-heater gaps were as shown in Table 2. Each of the GaAs crystal bodies was grown by adjusting a temperature distribution in the crucible to attain a temperature gradient of less than or equal to 1° C./mm at a crystal growth interface in a crystal growth direction.

2. Production of GaAs Crystal Substrate

The outer circumference of the obtained GaAs crystal body was ground and the obtained GaAs crystal body was sliced along a plane perpendicular to the crystal growth direction. Then, the main surface thereof was subjected to mechanical polishing and chemical mechanical polishing (CMP), thereby producing GaAs crystal substrates each having a diameter shown in Table 2 and a thickness of more than or equal to 325 μm and less than or equal to 700 μm (Examples II-1 to II-5). The EPD, oxygen concentration, carbon concentration, boron concentration, and specific resistance of each of the obtained GaAs crystal substrates were measured. The EPD was measured through image analysis by measuring the number of etch pits, which were generated in the surface thereof when the GaAs crystal substrate was soaked in 25 mass % of a KOH aqueous solution at 350° C. for 30 minutes, per unit area. The oxygen concentration and the carbon concentration were measured by CPAA (Charged Particle Activation Analysis). The boron concentration was measured by GDMS (Glow Discharge Mass Spectrometry). The specific resistance was measured by way of Hall measurement in accordance with the van der Pauw method. Results are collectively shown in Table 2, FIG. 4 and FIG. 5. Here, FIG. 4 and FIG. 5 include examples other than Examples II-1 to II-5.

Comparative Examples

For comparison with Examples I and II, GaAs crystal bodies and GaAs crystal substrates were produced in the same manner as in Examples I (in the case of n type conductivity) and Examples II (in the case of semi-insulating property) except for manufacturing methods and manufacturing conditions shown in Table 3 (Comparative Examples RI-1 to RI-3 and RII-1 to RII-3). It should be noted that each in Comparative Examples RI-1 and RII-1 was manufactured by a LEC (Liquid Encapsulated Czochralski) method, and a GaAs polycrystal having a purity of 99.9 mass % was used as the source material, C (carbon) was used as the semi-insulating impurity, and Si (silicon) was used as the n type conductivity impurity as with Examples I and II described above. The EPD, oxygen concentration, silicon concentration or carbon concentration, boron concentration, and specific resistance of each of the obtained GaAs crystal substrates were measured in the same manner as in Examples I or II. Results are collectively shown in Table 3, FIG. 4 and FIG. 5. Here, FIG. 4 includes comparative examples other than Comparative Examples RI-1 to RI-3 and RII-1 to RII-3.

TABLE 1

| Examples I | Example I-1 | Example I-2 | Example I-3 | Example I-4 | Example I-5 |
|---|---|---|---|---|---|
| Insulating Property/Conductivity | n Type Conductivity | n Type Conductivity | n Type Conductivity | n Type Conductivity | n Type Conductivity |
| Manufacturing Method | VB | VB | VB | VB | VB |
| Closure Ratio of Closure Plate (%) | 90 | 98 | 98 | 98 | 98 |
| Number of Inter-Heater Gaps | 4 | 4 | 1 | 4 | 4 |
| Crystal Substrate Diameter (mm) | 101.6 | 101.6 | 152.4 | 152.4 | 203.2 |
| EPD ($cm^{-2}$) | 400 | 100 | 1500 | 10 | 1800 |
| Oxygen Concentration (atoms · $cm^{-3}$) | $4.30 \times 10^{15}$ | $3.90 \times 10^{14}$ | $2.30 \times 10^{14}$ | $2.20 \times 10^{15}$ | $8.80 \times 10^{14}$ |
| Silicon Concentration (atoms · $cm^{-3}$) | $5.00 \times 10^{18}$ | $6.70 \times 10^{16}$ | $9.20 \times 10^{16}$ | $6.50 \times 10^{17}$ | $9.70 \times 10^{16}$ |

TABLE 1-continued

| Examples I | Example I-1 | Example I-2 | Example I-3 | Example I-4 | Example I-5 |
|---|---|---|---|---|---|
| Carbon Concentration (atoms · cm$^{-3}$) | — | — | — | — | — |
| Boron Concentration (atoms · cm$^{-3}$) | $5.20 \times 10^{18}$ | $3.30 \times 10^{17}$ | $3.60 \times 10^{17}$ | $1.70 \times 10^{18}$ | $4.10 \times 10^{17}$ |
| Specific Resistance (Ω · cm) | $1.20 \times 10^{-3}$ | $2.80 \times 10^{-2}$ | $4.20 \times 10^{-3}$ | $4.60 \times 10^{-3}$ | $3.90 \times 10^{-3}$ |
| Processing Yield in Processing Crystal Body into Crystal Substrate (%) | 92.5 | 91.2 | 90.1 | 91.2 | 90.2 |

TABLE 2

| Examples II | Example II-1 | Example II-2 | Example II-3 | Example II-4 | Example II-5 |
|---|---|---|---|---|---|
| Insulating Property/Conductivity | Semi-Insulating Property | Semi-Insulating Property | Semi-Insulating Property | Semi-Insulating Property | Semi-Insulating Property |
| Manufacturing Method | VB | VB | VB | VB | VB |
| Closure Ratio of Closure Plate (%) | 90 | 98 | 98 | 98 | 100 |
| Number of Inter-Heater Gaps | 4 | 4 | 1 | 4 | 1 |
| Crystal Substrate Diameter (mm) | 101.6 | 101.6 | 152.4 | 152.4 | 152.4 |
| EPD (cm$^{-2}$) | 5900 | 3800 | 4700 | 6000 | 9800 |
| Oxygen Concentration (atoms · cm$^{-3}$) | $6.10 \times 10^{15}$ | $3.50 \times 10^{14}$ | $2.50 \times 10^{14}$ | $1.10 \times 10^{15}$ | $2.65 \times 10^{14}$ |
| Silicon Concentration (atoms · cm$^{-3}$) | — | — | — | — | — |
| Carbon Concentration (atoms · cm$^{-3}$) | $7.10 \times 10^{14}$ | $7.00 \times 10^{15}$ | $8.30 \times 10^{15}$ | $1.20 \times 10^{15}$ | $1.40 \times 10^{16}$ |
| Boron Concentration (atoms · cm$^{-3}$) | $2.80 \times 10^{17}$ | $8.10 \times 10^{16}$ | $7.70 \times 10^{16}$ | $1.00 \times 10^{17}$ | $6.20 \times 10^{16}$ |
| Specific Resistance (Ω · cm) | $1.20 \times 10^{7}$ | $3.20 \times 10^{8}$ | $4.80 \times 10^{8}$ | $2.30 \times 10^{7}$ | $9.00 \times 10^{8}$ |
| Processing Yield in Processing Crystal Body into Crystal Substrate (%) | 92.2 | 92.7 | 91.4 | 92.1 | 90.3 |

TABLE 3

| | Comparative Examples | | | | | |
|---|---|---|---|---|---|---|
| | Comparative Example RI-1 | Comparative Example RI-2 | Comparative Example RI-3 | Comparative Example RII-1 | Comparative Example RII-2 | Comparative Example RII-3 |
| Insulating Property/Conductivity | n Type Conductivity | n Type Conductivity | n Type Conductivity | Semi-Insulating Property | Semi-Insulating Property | Semi-Insulating Property |
| Manufacturing Method | LEC | VB | VB | LEC | VB | VB |
| Closure Ratio of Closure Plate (%) | 0 | 0 | 0 | 0 | 0 | 0 |
| Number of Inter-Heater Gaps | 4 | 4 | 4 | 4 | 4 | 4 |
| Crystal Substrate Diameter (mm) | 101.6 | 101.6 | 152.4 | 101.6 | 101.6 | 152.4 |
| EPD (cm$^{-2}$) | 23000 | 5900 | 800 | 99000 | 9200 | 4200 |
| Oxygen Concentration (atoms · cm$^{-3}$) | $6.10 \times 10^{14}$ | $1.10 \times 10^{16}$ | $7.90 \times 10^{15}$ | $2.60 \times 10^{14}$ | $8.00 \times 10^{15}$ | $9.20 \times 10^{15}$ |
| Silicon Concentration (atoms · cm$^{-3}$) | $1.00 \times 10^{17}$ | $4.10 \times 10^{18}$ | $1.30 \times 10^{19}$ | — | — | — |
| Carbon Concentration (atoms · cm$^{-3}$) | — | — | — | $1.30 \times 10^{14}$ | $2.10 \times 10^{14}$ | $1.80 \times 10^{14}$ |
| Boron Concentration (atoms · cm$^{-3}$) | $5.30 \times 10^{17}$ | $1.20 \times 10^{19}$ | $9.10 \times 10^{18}$ | $7.70 \times 10^{16}$ | $3.70 \times 10^{17}$ | $4.40 \times 10^{17}$ |
| Specific Resistance (Ω · cm) | $1.10 \times 10^{-2}$ | $1.10 \times 10^{-3}$ | $1.30 \times 10^{-3}$ | $9.30 \times 10^{5}$ | $1.30 \times 10^{6}$ | $1.40 \times 10^{6}$ |
| Processing Yield in Processing Crystal Body into Crystal Substrate (%) | 86.1 | 89.4 | 89.7 | 84.8 | 89.6 | 88.7 |

Figure 4:
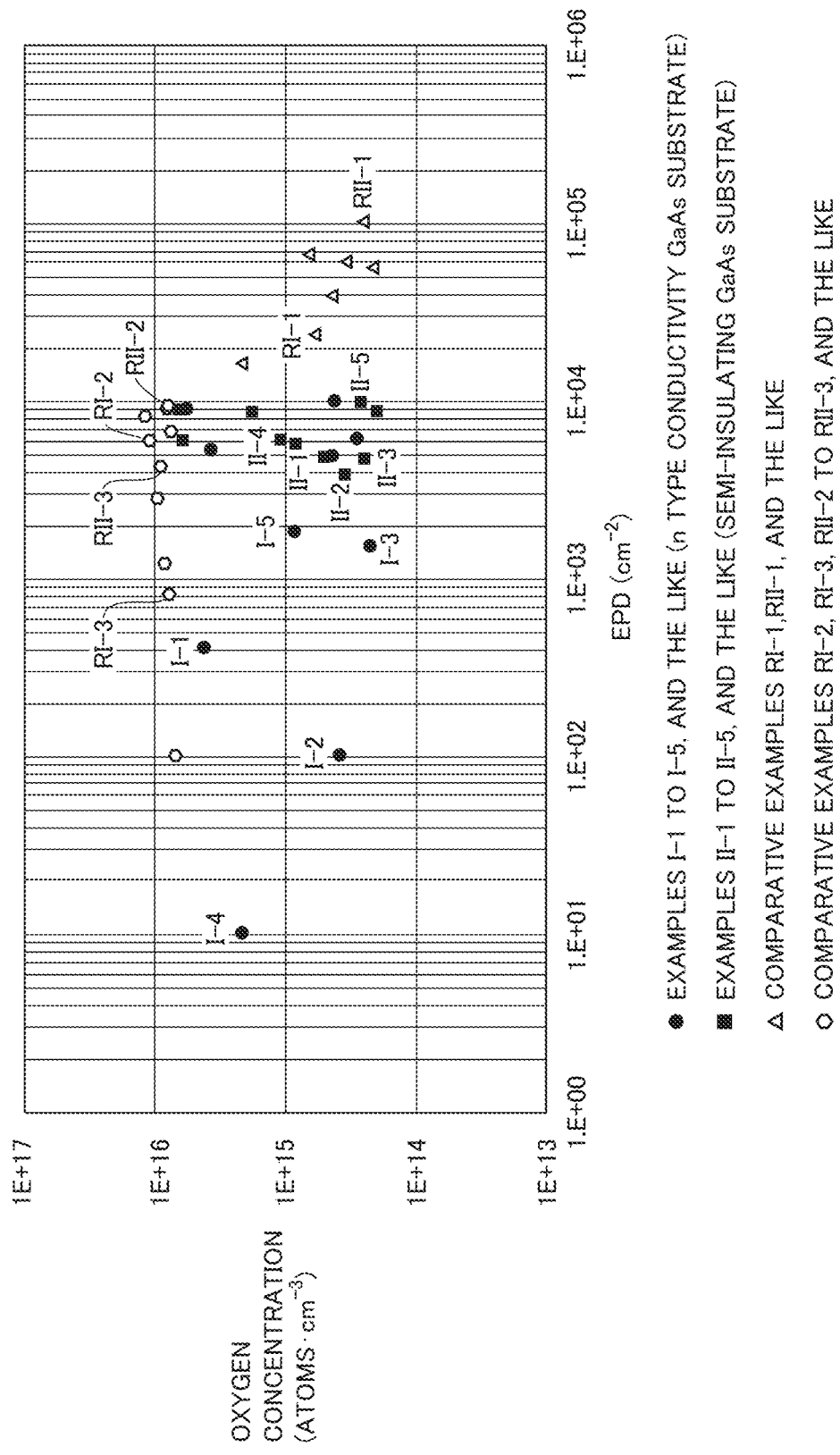
FIG. 4 is a graph showing a relation between an EPD (etching pit density) and an oxygen concentration in a gallium arsenide crystal substrate.

With reference to Tables 1 to 3 and FIG. 4, in both the cases of the n type conductivity and the semi-insulating property in Examples I-1 to I-5 and Examples II-1 to II-5, the EPD was so low as to be more than or equal to 10 cm$^{-2}$ and less than or equal to 10000 cm$^{-2}$ and the oxygen concentration was so low as to be less than $7.0 \times 10^{15}$ atoms·cm$^{-3}$. Accordingly, a processing yield in processing the GaAs crystal body into the GaAs crystal substrate was so high as to be more than or equal to 90%. On the other hand, as shown in Comparative Examples RI-1 and RII-1, in the GaAs crystal bodies and GaAs crystal substrates manufactured by the LEC method in both the cases of the n type conductivity and the semi-insulating property, the EPD was more than 10000 cm$^{-2}$, with the result that the processing yield in processing the GaAs crystal body into the GaAs crystal substrate was so low as to be less than 90%. Moreover, as shown in Comparative Examples RI-2 to RI-3 and RII-2 to RII-3, in the GaAs crystal bodies and GaAs crystal substrates manufactured by the conventional VB method in both the cases of the n type conductivity and the semi-insulating property, the oxygen concentration was so high as to be more than or equal to $7.0 \times 10^{15}$ atoms·cm$^{-3}$, with the result that the processing yield in processing the GaAs crystal body into the GaAs crystal substrate was so low as to be less than 90%.

Figure 5:
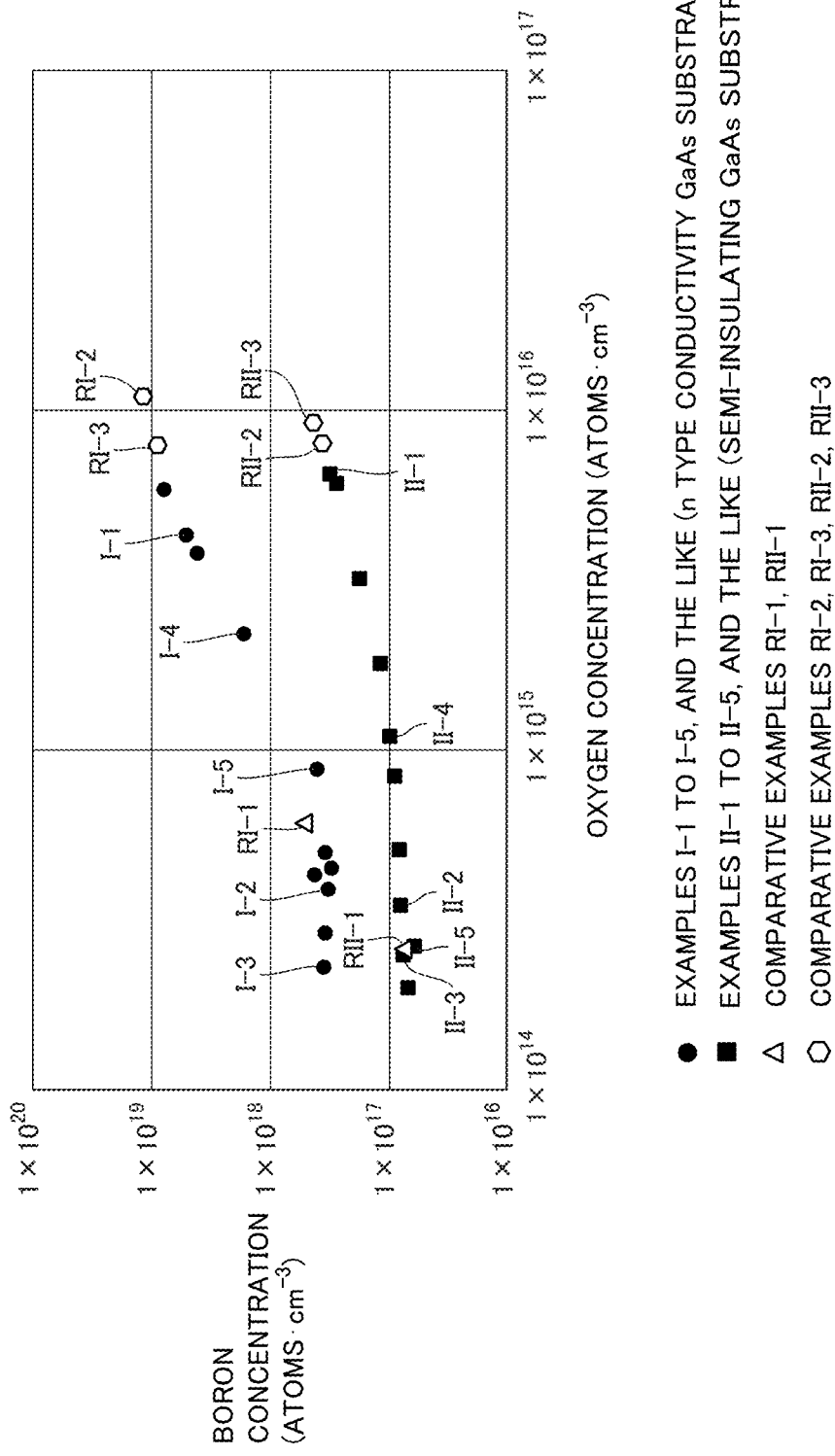
FIG. 5 is a graph showing a relation between the oxygen concentration and a boron concentration in the gallium arsenide crystal substrate.

Moreover, with reference to Tables 1 to 3 and FIG. 5, in Examples I-1 to I-5 and Examples II-1 to II-5, in the both cases of the n type conductivity and the semi-insulating property, there were obtained GaAs crystal substrates in each of which the oxygen concentration was so low as to be less than $7.0\times10^{15}$ atoms·cm$^{-3}$ and the boron concentration was so low as to be less than or equal to $1.0\times10^{19}$ atoms·cm$^{-3}$.

The embodiments and examples disclosed herein are illustrative and non-restrictive in any respect. The scope of the present invention is defined by the terms of the claims, rather than the embodiments and examples described above, and is intended to include any modifications within the scope and meaning equivalent to the terms of the claims.

REFERENCE SIGNS LIST

11: GaAs seed crystal; 13: GaAs source material; 21, 31: crucible; 21c, 31c: oxide film; 22, 32: crucible holder; 23, 33: sealing member; 24a, 24b, 34a, 34b, 34c, 34d: heater; 24abo, 34abo, 34bco, 34cdo: inter-heater gap; 25: closure plate; 25o: opening; 26: chamber.

The invention claimed is:

1. A gallium arsenide crystal body, wherein
an etching pit density of the gallium arsenide crystal body is more than or equal to 10 cm$^{-2}$ and less than or equal to 10000 cm$^{-2}$,
an oxygen concentration of the gallium arsenide crystal body is less than $5.0\times10^{15}$ atoms·cm$^{-3}$,
a carbon concentration of the gallium arsenide crystal body is more than or equal to $5.0\times10^{14}$ atoms·cm$^{-3}$ and less than $1.5\times10^{16}$ atoms·cm$^{-3}$,
a specific resistance of the gallium arsenide crystal body is more than or equal to $1.2\times10^{7}$ Ω·cm and less than or equal to $5.0\times10^{8}$ Ω·cm, and
the gallium arsenide crystal body comprising a straight body portion having a cylindrical shape, wherein a diameter of the straight body portion is more than or equal to 100 mm and less than or equal to 305 mm.

2. The gallium arsenide crystal body according to claim 1, wherein the oxygen concentration is more than or equal to $2.0\times10^{14}$ atoms·cm$^{-3}$ and less than $5.0\times10^{15}$ atoms·cm$^{3}$.

3. The gallium arsenide crystal body according to claim 1, wherein a boron concentration of the gallium arsenide crystal body is less than or equal to $1.0\times10^{19}$ atoms·cm$^{-3}$.

4. A gallium arsenide crystal substrate, wherein
an etching pit density of the gallium arsenide crystal substrate is more than or equal to 10 cm$^{-2}$ and less than or equal to 10000 cm$^{-2}$,
an oxygen concentration of the gallium arsenide crystal substrate is less than $5.0\times10^{15}$ atoms·cm$^{-3}$,
a carbon concentration of the gallium arsenide crystal substrate is more than or equal to $5.0\times10^{14}$ atoms·cm$^{-3}$ and less than $1.5\times10^{16}$ atoms·cm$^{-3}$,
a specific resistance of the gallium arsenide crystal substrate is more than or equal to $1.2\times10^{7}$ Ω·cm and less than or equal to $5.0\times10^{8}$ Ω·cm, and
a diameter of the gallium arsenide crystal substrate is more than or equal to 100 mm and less than or equal to 305 mm.

5. The gallium arsenide crystal substrate according to claim 4, wherein the oxygen concentration is more than or equal to $2.0\times10^{14}$ atoms·cm$^{-3}$ and less than $5.0\times10^{15}$ atoms·cm$^{3}$.

6. The gallium arsenide crystal substrate according to claim 4, wherein a boron concentration of the gallium arsenide crystal substrate is less than or equal to $1.0\times10^{19}$ atoms·cm$^{-3}$.

7. A gallium arsenide crystal substrate, wherein
an etching pit density of the gallium arsenide crystal substrate is more than or equal to 10 cm$^{-2}$ and less than or equal to 10000 cm$^{-2}$,
an oxygen concentration of the gallium arsenide crystal substrate is more than or equal to $2.0\times10^{14}$ atoms·cm$^{-3}$ and less than $5.0\times10^{15}$ atoms·cm$^{-3}$,
a carbon concentration of the gallium arsenide crystal substrate is more than or equal to $5.0\times10^{14}$ atoms·cm$^{-3}$ and less than $1.5\times10^{16}$ atoms·cm$^{-3}$,
a boron concentration of the gallium arsenide crystal substrate is less than or equal to $1.0\times10^{19}$ atoms·cm$^{-3}$,
a specific resistance of the gallium arsenide crystal substrate is more than or equal to $1.2\times10^{7}$ Ω·cm and less than or equal to $5.0\times10^{8}$ Ω·cm, and
a diameter of the gallium arsenide crystal substrate is more than or equal to 100 mm and less than or equal to 305 mm.

* * * * *